(12) United States Patent
Tan et al.

(10) Patent No.: US 9,523,725 B2
(45) Date of Patent: Dec. 20, 2016

(54) CONFIGURABLE ANALOG FRONT-END FOR MUTUAL CAPACITANCE SENSING AND SELF CAPACITANCE SENSING

(71) Applicants: STMicroelectronics Asia Pacific Pte Ltd, Singapore (SG);
STMicroelectronics S.r.l., Agrate Brianza (IT)

(72) Inventors: Kien Beng Tan, Singapore (SG);
Ernesto Lasalandra, San Donato Milanese (IT); Tommaso Ungaretti, Pavia (IT); Yannick Guedon, Singapore (SG); Dianbo Guo, Singapore (SG); Paolo Angelini, Bologna (IT); Giovanni Carlo Tripoli, Rho (IT)

(73) Assignees: STMICROELECTRONICS ASIA PACIFIC PTE LTD, Singapore (SG);
STMICROELECTRONICS S.R.L., Agrate Brianza (IT)

( * ) Notice: Subject to any disclaimer, the term of this patent is extended or adjusted under 35 U.S.C. 154(b) by 265 days.

(21) Appl. No.: 14/322,244

(22) Filed: Jul. 2, 2014

(65) Prior Publication Data
US 2014/0312919 A1    Oct. 23, 2014

Related U.S. Application Data

(63) Continuation of application No. 13/618,967, filed on Sep. 14, 2012, now abandoned, and a continuation of application No. 13/717,766, filed on Dec. 18, 2012, now Pat. No. 8,976,151.

(51) Int. Cl.
*G01R 27/26* (2006.01)
*G06F 3/044* (2006.01)
*G06F 3/041* (2006.01)

(52) U.S. Cl.
CPC .......... *G01R 27/2605* (2013.01); *G06F 3/044* (2013.01); *G06F 3/0416* (2013.01); *G06F 2203/04104* (2013.01)

(58) Field of Classification Search
CPC .... G01R 27/2605; G06F 3/0416; G06F 3/044; G06F 2203/04104
See application file for complete search history.

(56) References Cited

U.S. PATENT DOCUMENTS

2010/0328262 A1* 12/2010 Huang ................ G06F 3/0416
345/174
2014/0225858 A1    8/2014 Jo et al.

* cited by examiner

*Primary Examiner* — David Gray
*Assistant Examiner* — Michael Harrison
(74) *Attorney, Agent, or Firm* — Gardere Wynne Sewell, LLP (57) ABSTRACT

Capacitance sensing circuits and methods are provided. A dual mode capacitance sensing circuit includes a capacitance-to-voltage converter having an amplifier and an integration capacitance coupled between an output and an inverting input of the amplifier, and a switching circuit responsive to mutual mode control signals for a controlling signal supplied from a capacitive touch matrix to the capacitive to voltage converter in a mutual capacitance sensing mode and responsive to self mode control signals for controlling signals supplied from the capacitive touch matrix to the capacitance-to-voltage converter in a self capacitance sensing mode, wherein the capacitance sensing circuit is configurable for operation in the mutual capacitance sensing mode or the self capacitance sensing mode.

15 Claims, 11 Drawing Sheets

CONFIGURABLE ANALOG FRONT-END FOR MUTUAL CAPACITANCE SENSING AND SELF CAPACITANCE SENSING

PRIORITY CLAIM

This application is a continuation filing of U.S. Ser. No. 13/618,967 filed Sep. 14, 2012, and also claims priority to U.S. Ser. No. 13/717,766 filed Dec. 18, 2012, which is a continuation-in-part of U.S. Ser. No. 13/618,967 filed Sep. 14, 2012, the disclosures of which are incorporated by reference.

TECHNICAL FIELD

Embodiments relate to capacitance sensing and, more particularly, to an analog front end that is configurable for capacitance sensing in a mutual sensing mode or in a self sensing mode.

BACKGROUND

A touch screen is a device that can detect an object in contact with or in proximity to a display area. The display area can be covered with a touch-sensitive matrix that can detect a user's touch by way of a finger or stylus, for example. Touch screens are used in various applications such as mobile phones and other mobile devices. A touch screen may enable various types of user input, such as touch selection of items on the screen or alphanumeric input via a displayed virtual keypad. Touch screens can measure various parameters of the user's touch, such as the location, duration, etc.

One type of touch screen is a capacitive touch screen. A capacitive touch screen may include a matrix of conductive lines and conductive columns overlaid on the display area. The conductive lines and the conductive columns do not contact each other. The capacitive touch screen may be used for mutual capacitance sensing or for self capacitance sensing.

In mutual capacitance sensing, the capacitance between each line and column of the matrix may be sensed. A change in the sensed capacitance between a line and a column may indicate that an object, such as a finger, is touching the screen or is in proximity to the screen near the region of intersection of the line and column. Mutual capacitance sensing circuits employ a "forcing" signal applied to a column conductor of the capacitive touch matrix and sensing of the coupled signal on respective line conductors (or vice-versa).

In self capacitance sensing, the capacitance between a conductive element of the capacitive touch matrix and a reference voltage, such as ground, is sensed. A change in the sensed capacitance may indicate that an object, such as a finger, is touching the screen or is in proximity to the screen near the conductive element being sensed. The scanning of the capacitive touch matrix involves alternate sensing of the conductive lines and the conductive columns.

Mutual capacitance sensing and self capacitance sensing have advantages and disadvantages in different applications. Existing capacitance sensing circuitry is dedicated to either mutual capacitance sensing or self capacitance sensing.

SUMMARY

According to embodiments, a configurable analog front end for capacitance sensing is provided. The analog front end is configurable for operation in a mutual capacitance sensing mode or a self capacitance sensing mode. In embodiments, a configurable single-ended to differential capacitance-to-voltage converter is provided. A floating shield may be used to enhance the sensitivity of self capacitance sensing. The differential capacitance-to-voltage converter limits substrate noise and therefore provides a very high intrinsic SNR (Signal-to-Noise Ratio).

In one aspect, a dual mode capacitance sensing circuit comprises a capacitance-to-voltage converter including an amplifier and an integration capacitance coupled between an output and an inverting input of the amplifier, and a switching circuit responsive to mutual mode control signals for controlling signals supplied from a capacitive touch matrix to the capacitance-to-voltage converter in a mutual capacitance sensing mode and responsive to self mode control signals for controlling signals supplied from the capacitive touch matrix to the capacitance-to-voltage converter in a self capacitance sensing mode, wherein the capacitance sensing circuit is configurable for operation in the mutual capacitance sensing mode or the self capacitance sensing mode.

BRIEF DESCRIPTION OF THE DRAWINGS

For a better understanding of the described embodiments, reference is made to the accompanying drawings, which are incorporated herein by reference and in which.

DETAILED DESCRIPTION

Figure 1A:
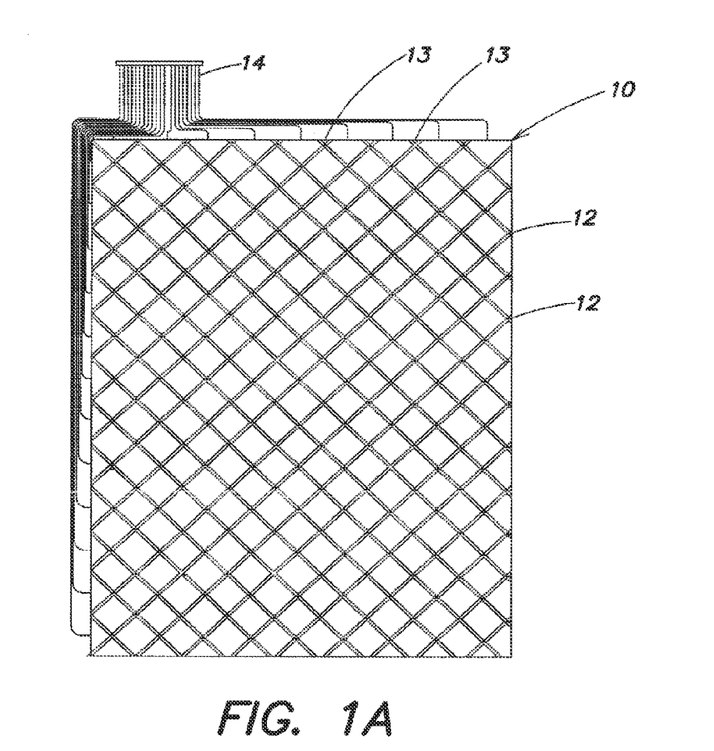
FIG. 1A is a schematic representation of a capacitive touch matrix.

FIG. 1A shows an example of a touch screen having conductive lines 12 and conductive columns 13 of a capacitive touch matrix 10, arranged in a diamond pattern. The capacitive touch matrix 10 may be transparent to allow light from an underlying display unit to pass through the capacitive touch matrix 10 for viewing by a user. A plurality of conductors 14 may be provided for making contact to conductive lines 12 and conductive columns 13. Conductive lines 12 and conductive columns 13 may cover substantially the entire face of the touch screen, enabling touch and proximity detection at substantially any location on the touch screen.

Figure 1B:
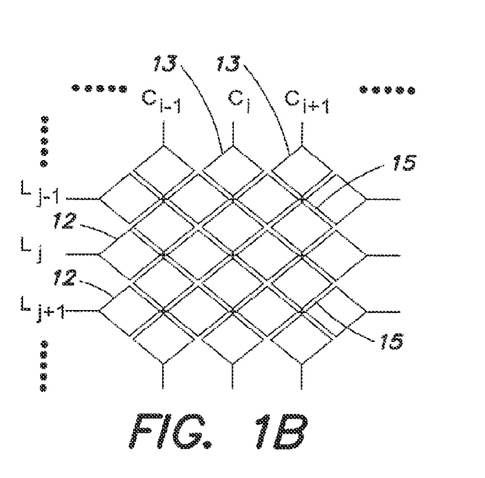
FIG. 1B is an enlarged schematic diagram of a portion of the capacitive touch matrix, showing line and column conductors having diamond configurations.

FIG. 1B shows an enlarged portion of the capacitive touch matrix 10 in further detail. The capacitive touch matrix 10 includes a plurality of conductive columns 13 ($C_i$) and a plurality of conductive lines 12 ($L_j$). The conductive columns 13 extend vertically and the conductive lines 12 extend horizontally in FIG. 1B. The conductive lines 12 and the conductive columns 13 cross above or below each other at their intersection points, but are not in contact with one another. Each of the conductive lines 12 and the conductive columns 13 has conductors arranged in a diamond pattern. As a result, the conductive lines 12 and the conductive columns 13 are separated from each other by capacitive gaps 15. The diamond pattern may provide increased capacitance between conductive lines 12 and conductive columns 13, as compared with straight conductors. Capacitive touch matrix 10 may sense an object that modifies the fringing electric field above the capacitive gaps 15 when the object is in contact or in proximity to the screen.

Figure 1C:
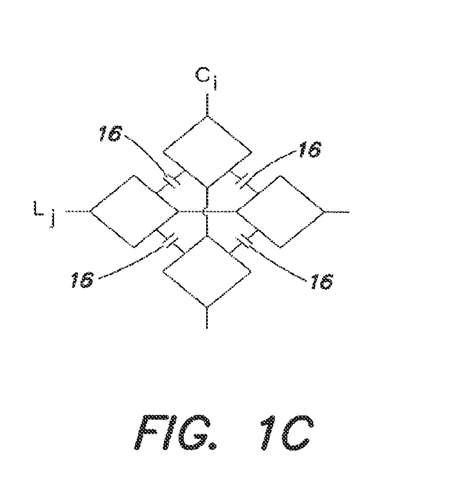
FIG. 1C is a schematic diagram of a single intersection of a line and column, illustrating capacitances between line and column conductors.

FIG. 1C shows that when a conductive column $C_i$ and a conductive line $L_j$ are selected, the total capacitance between column $C_i$ and line $L_j$ is the sum of four capacitances 16 between the four adjacent diamond-shaped regions of column $C_i$ and line $L_j$. The capacitance between column $C_i$ and line $L_j$ can be sensed to determine whether an object is in contact with or in proximity to the touch screen above the region in which the four capacitances 16 are formed. Each conductive line 12 and conductive column 13 of the capacitive touch matrix may be selected in succession to sense the capacitances at each position of the touch screen.

Figure 2:
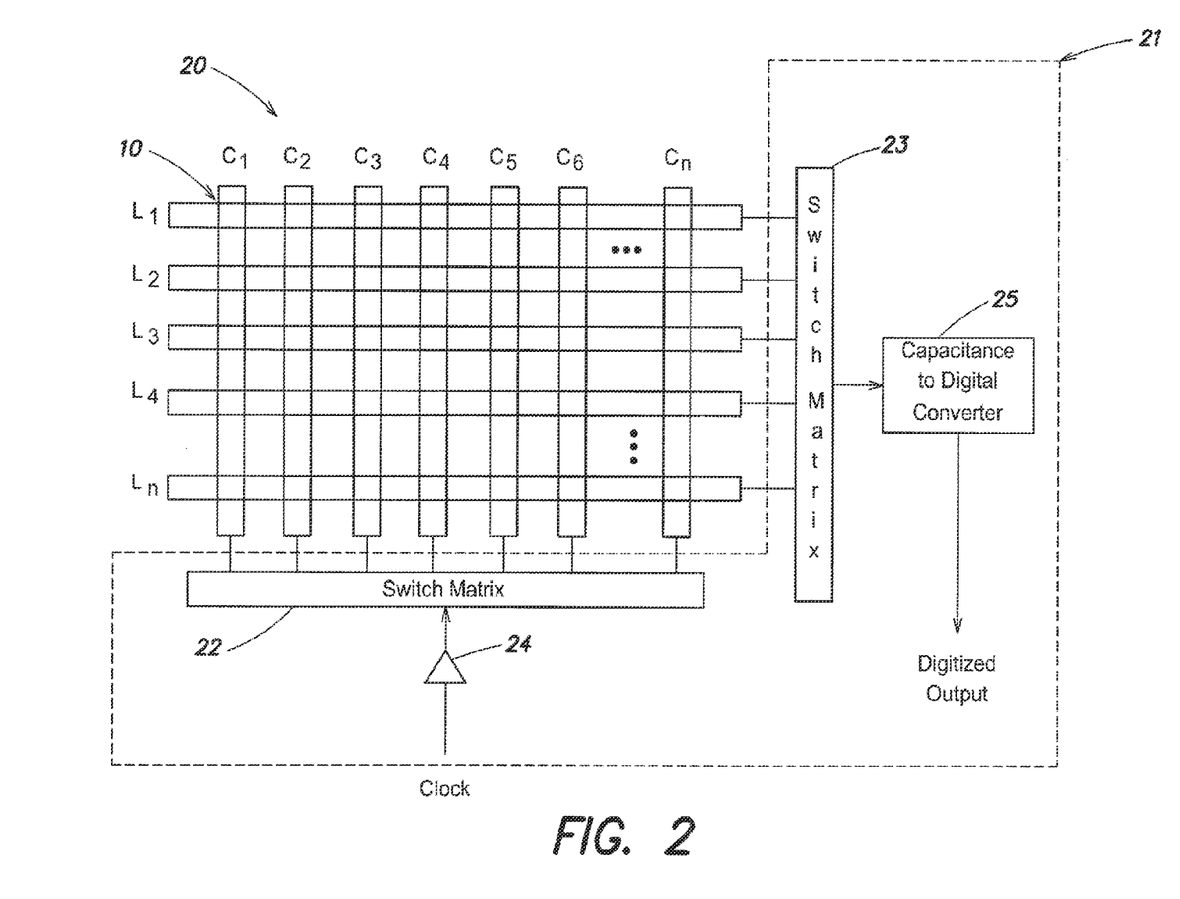
FIG. 2 is a schematic diagram of a touch screen system.

FIG. 2 is a block diagram of a touch screen system 20 that includes the capacitive touch matrix 10 and an associated sensing circuit 21. The touch screen system of FIG. 2 is configured for mutual capacitance sensing. As discussed above, the capacitive touch matrix 10 may have a diamond pattern, which is not shown in FIG. 2 for clarity. The sensing circuit 21 includes a column switch matrix 22 and a line switch matrix 23 for selection of columns and lines of the capacitive touch matrix. The column switch matrix 22 may receive a clock signal from a buffer 24 for timing the switch selection and scanning of the capacitive touch matrix. The line switch matrix 23 may select one or more lines for readout. The charge sensed from the capacitive touch matrix may be converted to a digital value by a capacitance-to-digital converter 25, as discussed below.

In mutual capacitance sensing, a forcing signal is applied to a column conductor (or to a line conductor), and a coupled signal is sensed on one or more line conductors (or column conductors). The lines and columns of the capacitive touch matrix 10 may be scanned in any suitable manner. For example, the capacitance may be sensed between column $C_1$ and lines $L_1$-$L_n$, then sensed between column $C_2$ and lines $L_1$-$L_n$, and so on until column $C_n$ and lines $L_1$-$L_n$. However, it should be appreciated that this is only an example of a suitable scanning sequence and that any suitable scanning sequence may be used.

At each scanning step, a measurement may be taken from the line/column pair that represents the capacitance between the selected line/column pair. For example, the capacitance between the selected line/column pair may be charged to a determined voltage value. The amount of charge stored depends on the capacitance between the line/column pair. The capacitance between the selected line and column may change when an object is touching the touch screen near the intersection area of the line and column and alters the electric field in this region. To determine whether an object is in the vicinity, the stored charge can be read out and converted into a voltage that is then digitized.

In self capacitance sensing, a forcing signal is applied to the column conductors, and the capacitance to ground is sensed on the same column conductors. Then, a forcing signal is applied to the line conductors, and the capacitance to ground is sensed on the same line conductors. The combined information from column sensing and line sensing indicates the location of a touch on the capacitive touch matrix. The sequence of sensing on column conductors and sensing on line conductors is repeated.

Figure 3:
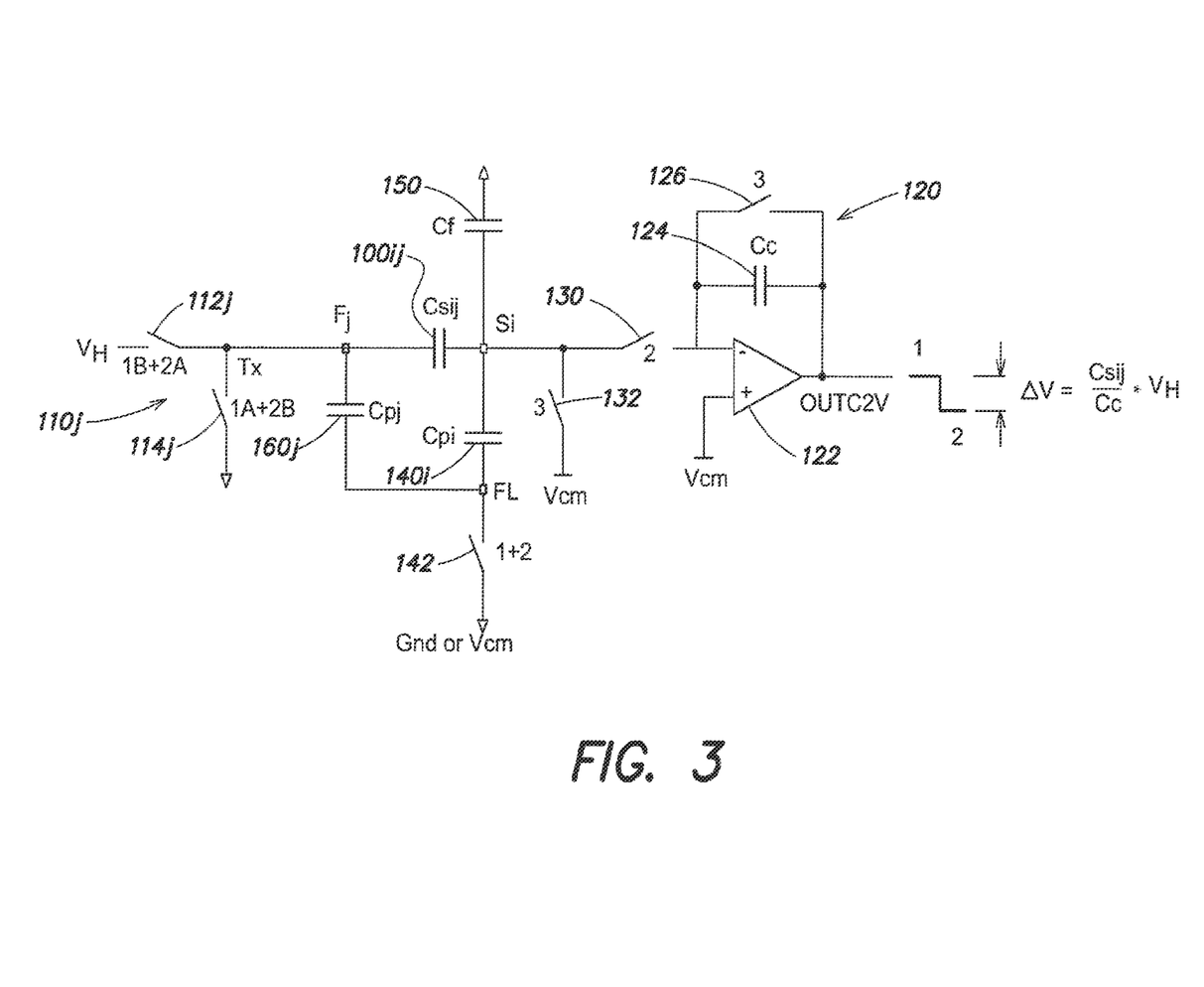
FIG. 3 is a schematic diagram of a single-ended mutual capacitance sensing circuit in accordance with embodiments.

A schematic block diagram of a single-ended mutual capacitance sensing circuit in accordance with embodiments is shown in FIG. 3. An element of the capacitive touch matrix is represented by matrix element capacitance 100. Capacitance 100 may have a value of Cs in the absence of a finger or other object and may have a value of Cs+ΔCs when a finger or other object is present. Capacitance Cs represents the capacitance between a column conductor and a line conductor of the capacitive touch matrix, and capacitance ΔCs represents the change in capacitance produced by a finger or other object touching or in proximity to the intersection between the column conductor and the line conductor of the capacitive touch matrix. Capacitance 100 is shown as connected between a force node $F_j$ and a sense node $S_i$. A forcing signal is applied to force node $F_j$ and a sensing signal is read out at sense node $S_i$.

A DC voltage VH is chopped by an input chopper 110 at a modulation frequency fc to provide a squarewave output at frequency fc. Input chopper 110 includes a switch 112 coupled between voltage VH and force node $F_j$, and a switch 114 coupled between force node $F_j$ and ground. The squarewave output of chopper 110 causes the capacitance 100 to be charged. A sensing signal at sense node $S_i$ is applied to a capacitance-to-voltage converter 120.

The capacitance-to-voltage converter 120 may include an amplifier 122 having an integration capacitance 124 (Cc) in a feedback path between an inverting input and an output of amplifier 122. A switch 126 is connected in parallel with integration capacitance 124. A non-inverting input of amplifier 122 is connected to a common mode voltage Vcm. For a given matrix element capacitance 100, the output OUTC2V of capacitance-to-voltage converter 120 is a waveform at frequency fc having a voltage given by:

$$Vout = Vcm + Cs/Cc * VH$$

As shown in FIG. 3, sense node $S_i$, is coupled through a switch 130 to the inverting input of amplifier 122 and is connected through a switch 132 to ground. A parasitic capacitance to a floating node FL is represented by parasitic capacitance 140 (Cp). The floating node FL may be a transparent conductive layer between the touch screen and the display. Floating node FL is connected by a switch 142 to ground or to the common mode voltage Vcm. The capacitance of a finger touching or in proximity to capacitance 100 is represented by finger capacitance 150 (Cf).

Figure 4:
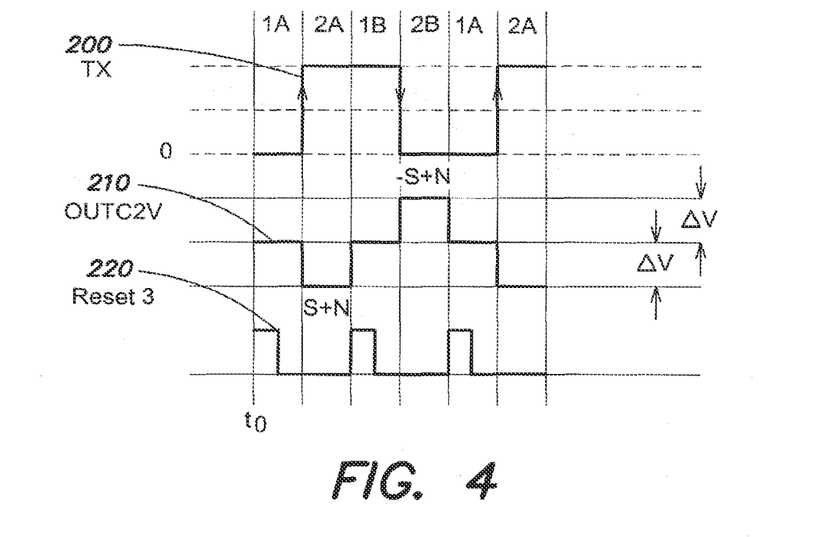
FIG. 4 is a timing diagram that illustrates operation of the mutual capacitance sensing circuit of FIG. 3.

A timing diagram that illustrates operation of the mutual capacitance sensing circuit of FIG. 3 is shown in FIG. 4. A waveform 200 represents the signal TX applied to force node $F_j$. Waveform 200 may be a squarewave at frequency fc. A waveform 210 represents the output OUTC2V of amplifier 122. The amplitude of the output signal OUTC2V is representative of the value of the capacitance 100 being sensed. A waveform 220 represents a reset signal applied to switches 126 and 132 at a frequency 2fc of twice the squarewave input frequency.

Figure 5A:
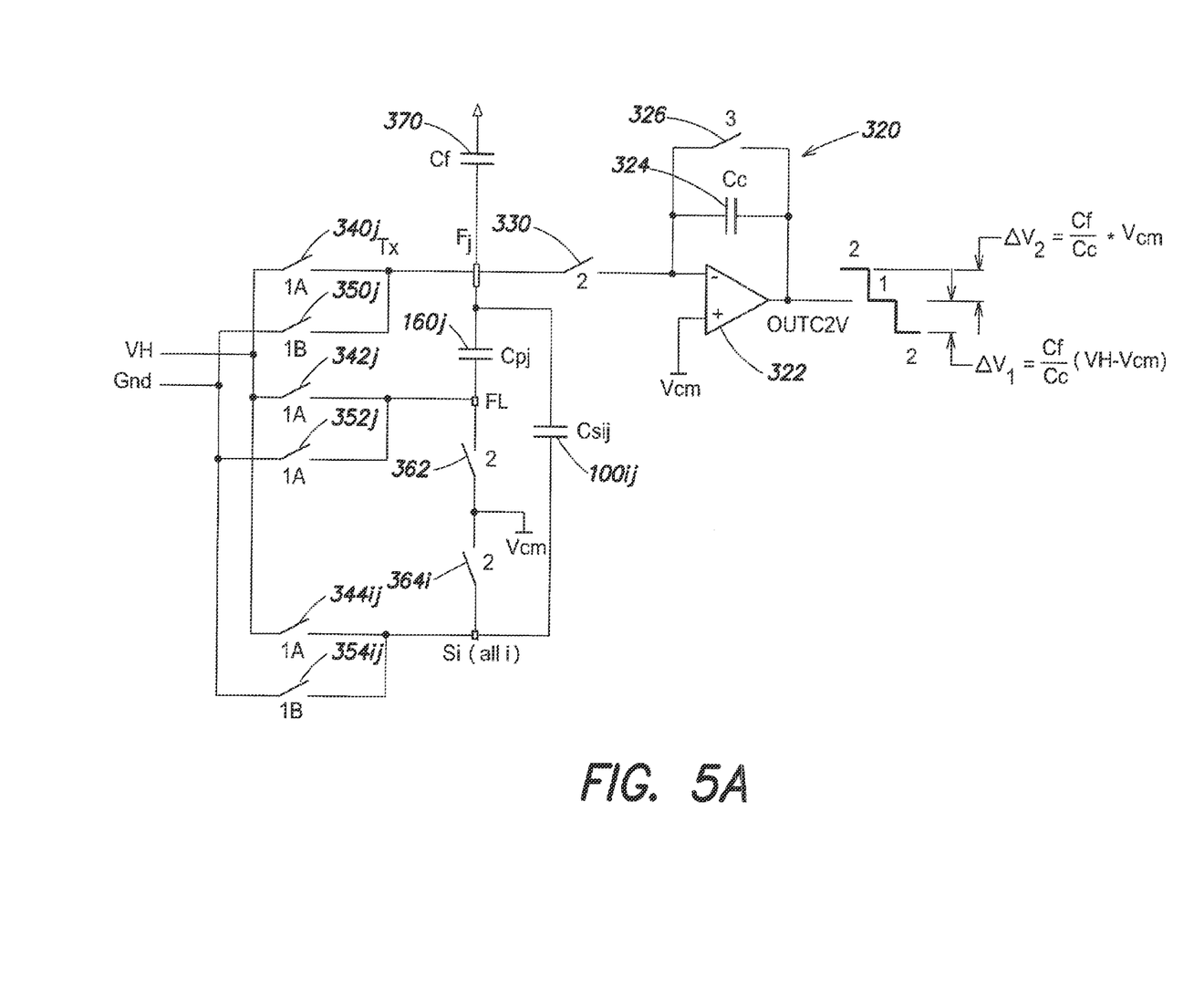
FIG. 5 is a schematic diagram of a single-ended self capacitance sensing circuit in accordance with embodiments.
Figure 5B:
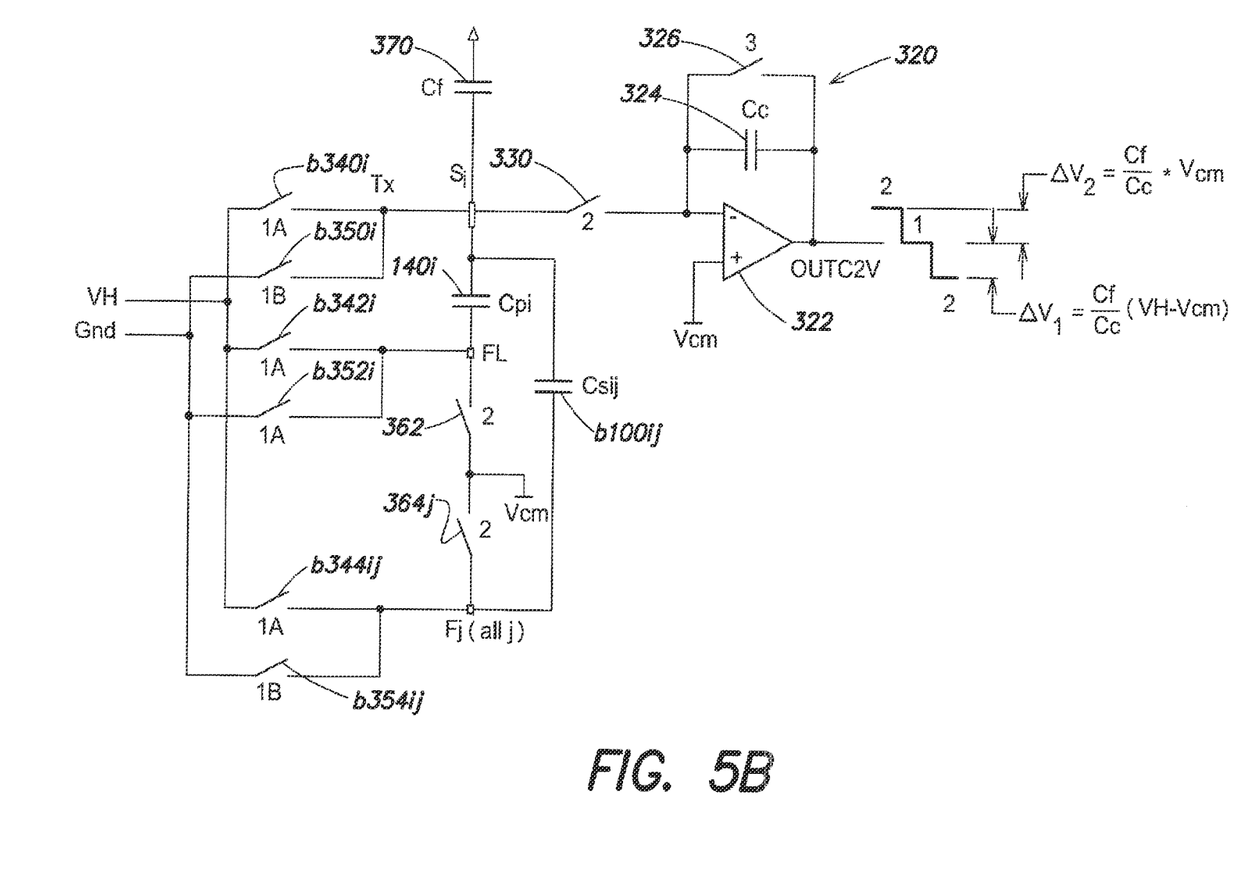

A schematic block diagram of a single-ended self capacitance sensing circuit in accordance with embodiments is shown in FIG. 5. A capacitance-to-voltage converter 320 may include an amplifier 322 having an integration capacitance 324 (Cc) in a feedback path between an inverting input and an output of amplifier 322. A switch 326 is connected in parallel with integration capacitance 324 (Cc). A non-inverting input of amplifier 322 is connected to the common mode voltage Vcm.

A force node $F_j$ of the capacitive touch matrix is connected through a switch 330 to the inverting input of amplifier 322. A voltage VH is coupled through a switch 340 to force node $F_j$, is coupled through a switch 342 to floating node FL and is coupled through a switch 344 to sense node $S_i$. Ground is coupled through a switch 350 to force node $F_j$, is coupled through a switch 352 to floating node FL and is coupled through a switch 354 to sense node $S_i$. Switches 340 and 350 implement a first input chopper, switches 342 and 352 implement a second input chopper, and switches 344 and 354 implement a third input chopper. A parasitic capacitance between force node $F_j$ and floating node FL is represented by parasitic capacitance 360 (Cp). A switch 362 is coupled between floating node FL and common mode voltage Vcm, and a switch 364 is coupled between sense node $S_i$ and common mode voltage Vcm. The capacitance of a finger touching or in proximity to a conductor of the capacitive touch matrix is represented by finger capacitance 370 (Cf) connected between force node $F_j$ and ground.

Figure 6:
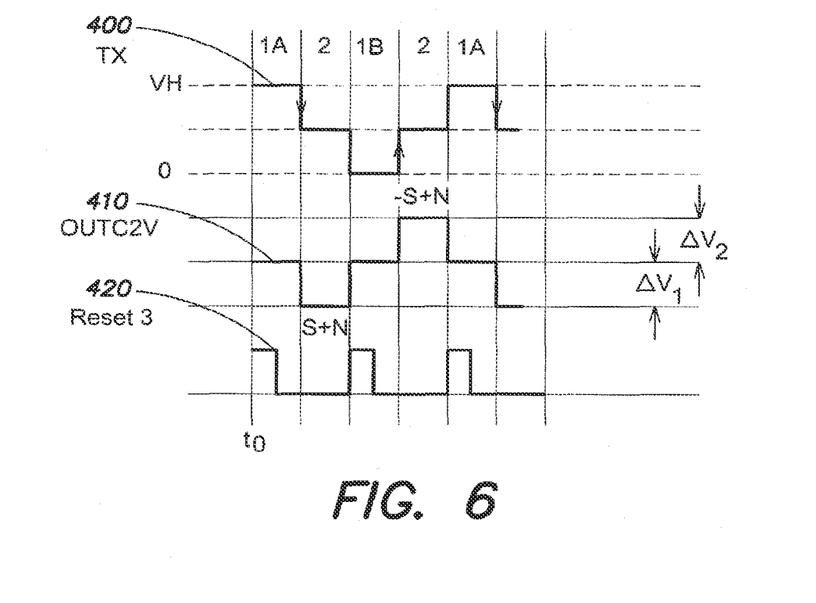
FIG. 6 is a timing diagram that illustrates operation of the self capacitance sensing circuit of FIG. 5.

A timing diagram that illustrates operation of the self capacitance sensing circuit of FIG. 5 is shown in FIG. 6. The timing diagram indicates the times when the various switches in the capacitance sensing circuit of FIG. 5 are closed. A waveform 400 represents a transmit signal TX at force node $F_j$. As shown, the transmit signal TX is successively switched to voltage VH, common mode voltage Vcm and ground. A waveform 410 represents the output OUTC2V of amplifier 322. A waveform 420 represents a reset signal applied to switch 326 of the capacitance-to-voltage converter at the frequency 2fc of twice the input frequency.

Figure 7:
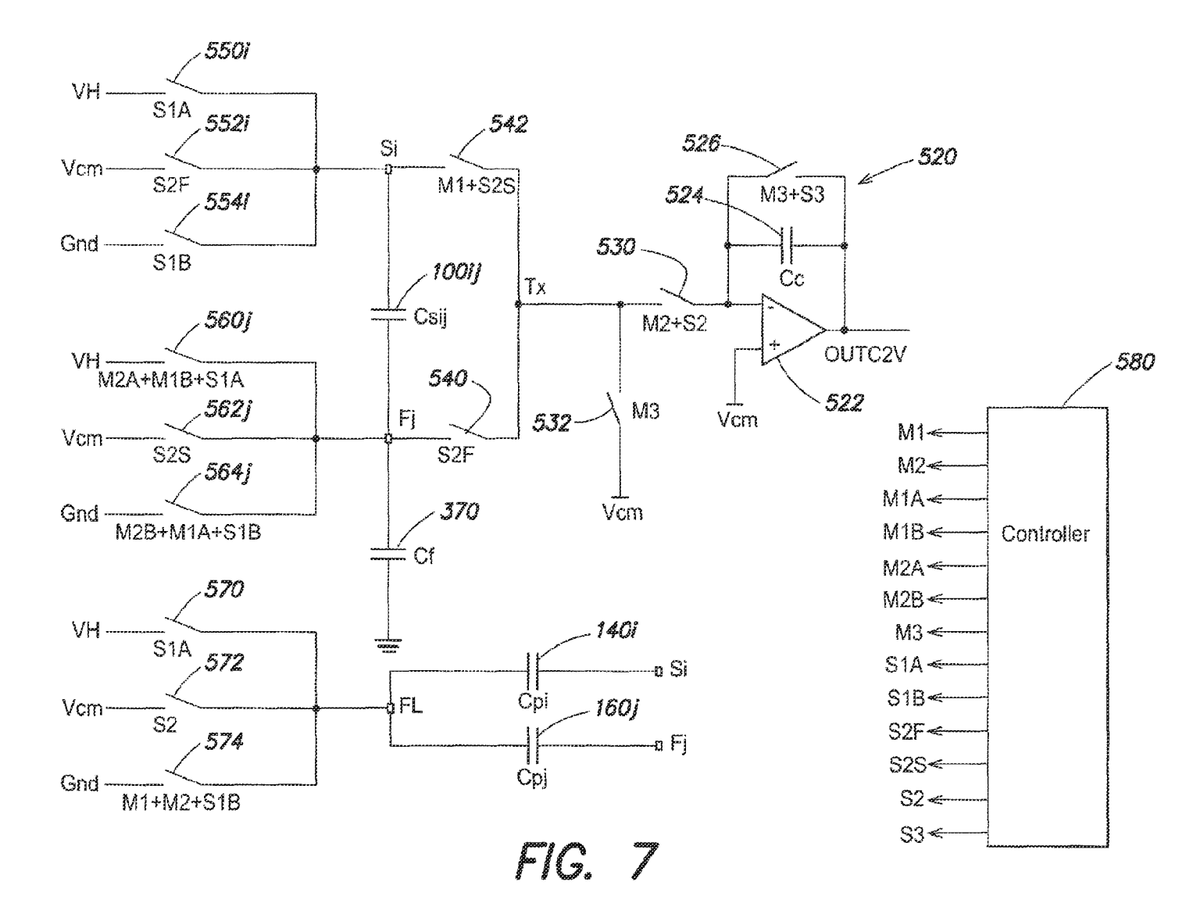
FIG. 7 is a schematic diagram of a dual mode capacitance sensing circuit in accordance with embodiments.

A schematic block diagram of a single-ended, dual mode capacitance sensing circuit in accordance with embodiments is shown in FIG. 7. The capacitance sensing circuit of FIG. 7 is configurable for operation in the mutual capacitance sensing mode or in the self capacitance sensing mode.

A capacitance-to-voltage converter 520 includes an amplifier 522 having an integration capacitance 524 (Cc) coupled between the inverting input and the output of amplifier 522. A switch 526 is connected in parallel with integration capacitance 524. A non-inverting input of amplifier 522 is connected to common mode voltage Vcm.

A node TX is coupled through a switch 530 to the inverting input of amplifier 522, and node TX is coupled through a switch 532 to common mode voltage Vcm. The force node $F_j$ is coupled through a switch 540 to node TX, and the sense node $S_i$ is coupled through a switch 542 to node TX. Sense node $S_i$ is coupled through a switch 550 to voltage VH, is coupled through a switch 552 to common mode voltage Vcm, and is coupled through a switch 554 to ground. Force node $F_j$ is coupled through a switch 560 to voltage VH, is coupled through a switch 562 to common mode voltage Vcm, and is coupled through a switch 564 to ground. Floating node FL is coupled through a switch 570 to voltage VH, is coupled through a switch 572 to common mode voltage Vcm, and is coupled through a switch 574 to ground.

Figure 8:
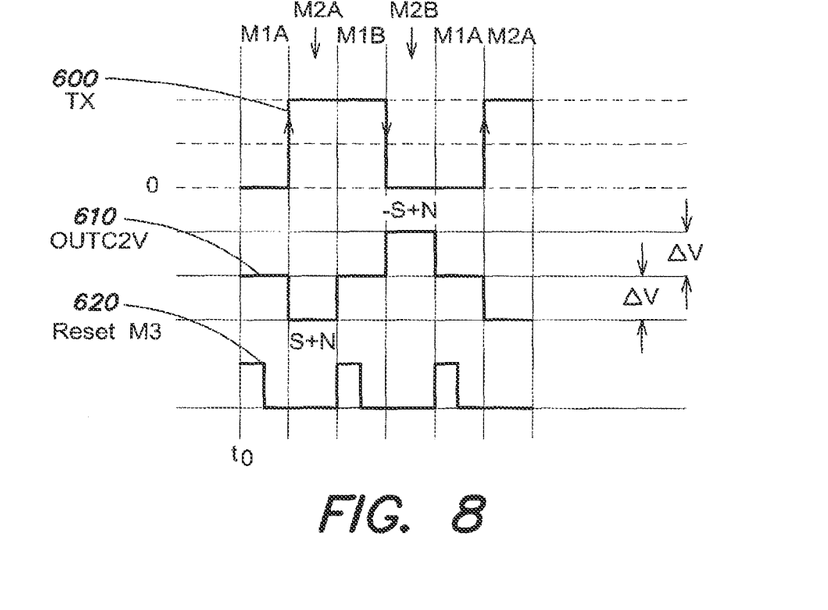
FIG. 8 is a timing diagram that illustrates operation of the capacitance sensing circuit of FIG. 7 in the mutual capacitance sensing mode.

A timing diagram that illustrates operation of the dual mode capacitance sensing circuit of FIG. 7 in the mutual capacitance sensing mode is shown in FIG. 8. In FIG. 7, switches labeled with timing signals having the prefix "M" are utilized in the mutual capacitance sensing mode. The switches labeled with timing signals having the prefix "S" may not be utilized in the mutual capacitance sensing mode. As shown, some switches are utilized in both the mutual capacitance sensing mode and the self capacitance sensing mode. In FIG. 8, a waveform 600 comprising a squarewave at frequency fc is applied to force node $F_j$ and is coupled through matrix element capacitance 100 (Cs) and sense node $S_i$ to transmit node TX. The capacitance-to-voltage converter 520 provides an output OUTC2V, as indicated by waveform 610. The amplitude of the output OUTC2V is representative of the value of the capacitance Cs being sensed. A waveform 620 represents a reset signal applied to switches 526 and 532 at the frequency 2fc of twice the squarewave input frequency.

Figure 9:
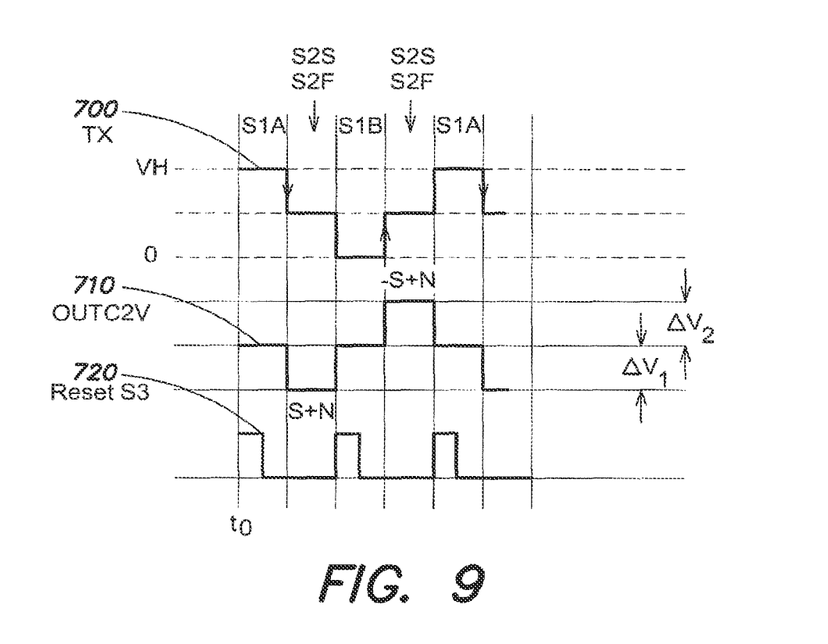
FIG. 9 is a timing diagram that illustrates operation of the capacitance sensing circuit of FIG. 7 in the self capacitance sensing mode.

A timing diagram that illustrates operation of the dual mode capacitance sensing circuit of FIG. 7 in the self capacitance sensing mode is shown in FIG. 9. Switches in FIG. 7 labeled with timing signals having the prefix "S" are involved in the self capacitance sensing mode. A waveform 700 represents the signal at transmit node TX. As shown, the waveform is successively switched to voltage VH, the common mode voltage Vcm and ground. When the column conductors of the capacitive touch matrix are being sensed, switch 540 is closed, and switches 560, 562 and 564 are controlled to produce waveform 700. When the line conductors of the capacitive touch matrix are being sensed, switch 542 is closed, and switches 550, 552 and 554 are controlled to generate waveform 700. A waveform 710 represents the output OUTC2V of amplifier 522. The amplitude of the output OUTC2V is representative of the finger capacitance 370 (Cf) between the column or line conductor being sensed and ground. The waveform 720 represents a reset signal applied to switch 526 of the capacitance-to-voltage converter 520 at the frequency 2fc of twice the input frequency.

The timing signals, as shown in FIGS. 8 and 9, for controlling the dual mode capacitance sensing circuit in the mutual capacitance sensing mode or the self capacitance sensing mode may be generated by a controller 580. The controller 580 is programmed to generate synchronized timing signals for controlling the switches in the capacitance sensing circuit of FIG. 7. The switches may be implemented, for example, by transistors, and the on-off states of the transistors may be controlled by controller 580.

Whether mutual capacitance sensing or self capacitance sensing is performed, the output signal OUTC2V of the capacitance-to-voltage converter is chopped. In particular, the signal from the transmit node TX is chopped, while the offset and flicker noise of the amplifier 522 are not chopped. Therefore, the output OUTC2V of the capacitance-to-voltage converter 520 may be rectified, accumulated and filtered by an output chopper and an analog accumulator/filter. By these operations, the original signal, which is representative of the capacitance being sensed is restored and is free of the offset and flicker of the amplifier 522. The offset and flicker of the amplifier are rejected to higher frequencies by the chopper. The white noise of the amplifier may be low pass filtered. The differential output of the accumulator can be amplified and then converted to digital domain for further processing.

Figure 10:
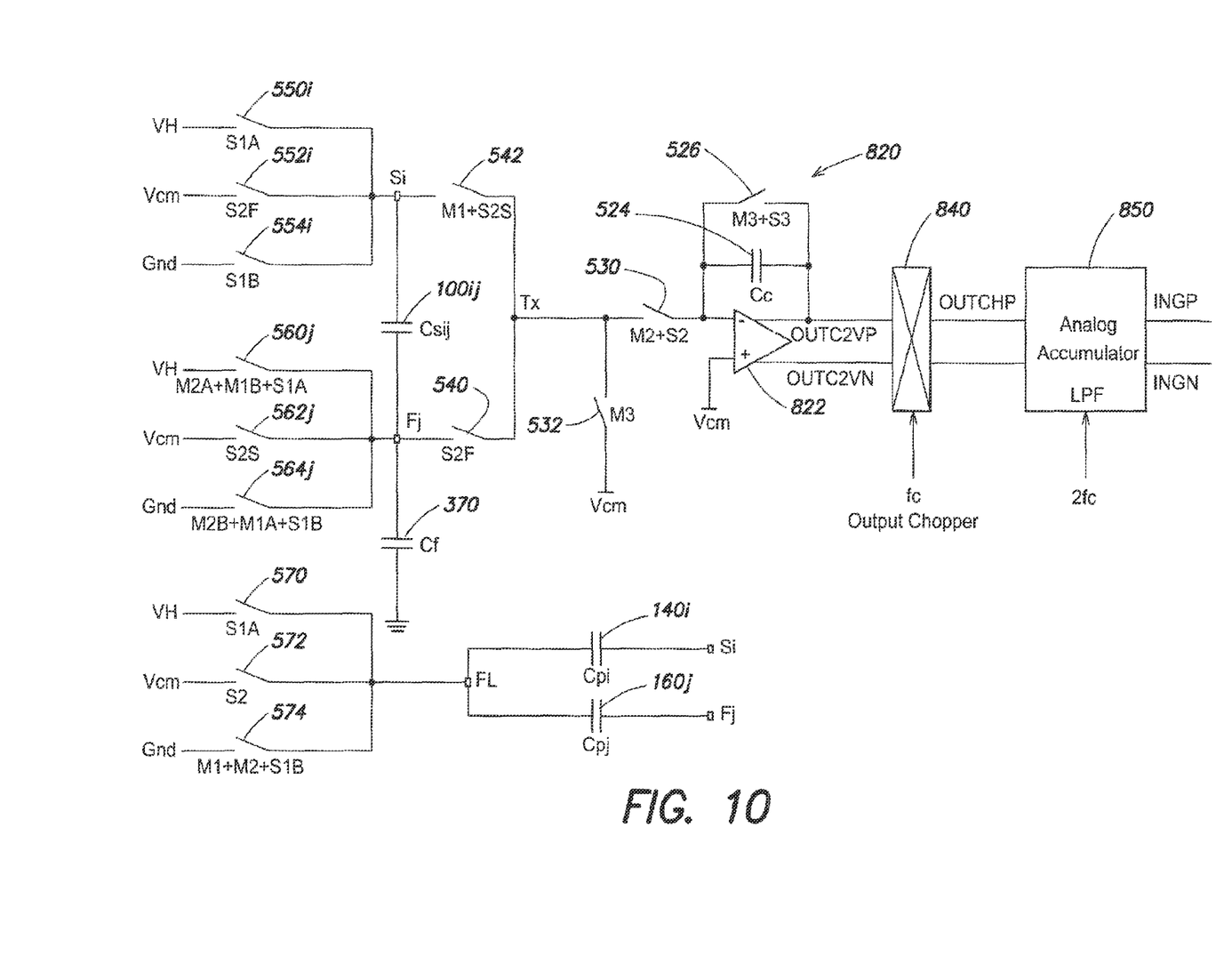
FIG. 10 is a schematic diagram of a dual mode capacitance sensing circuit including a capacitance-to-voltage converter with a single-ended input and a differential output in accordance with embodiments.

A schematic diagram of a dual mode capacitance sensing circuit including a capacitance-to-voltage converter with a single-ended input and a differential output, in accordance with embodiments, is shown in FIG. 10. Like elements in FIGS. 7 and 10 have the same reference characters. A capacitance-to-voltage converter 820 may include a differential amplifier 822 having integration capacitance 524 connected in a feedback path between an inverting input and a first output of amplifier 822. The non-inverting input of differential amplifier 822 is connected to the common mode voltage Vcm. The switching circuit which provides signals to the capacitance-to-voltage converter 820 in the mutual capacitance sensing mode and in the self capacitance sensing mode may be as described above in connection with FIG. 7.

The differential outputs OUTC2VP and OUTC2VN of capacitance-to-voltage converter 820 are supplied through a differential output chopper 840 to a differential analog accumulator/filter 850. The outputs of capacitance-to-voltage converter 820 are switched by output chopper 840 at frequency fc to produce DC outputs OUTCHP and OUTCHN that are representative of the capacitance being sensed. The output chopper 840 functions as a rectifier of the signals at its inputs.

The analog accumulator/filter 850 accumulates DC voltage values produced by capacitance-to-voltage converter 820 on successive sensing cycles, over an accumulation period having a defined number NA of cycles. The DC outputs of output chopper 840 on each cycle are summed with intermediate accumulated values from previous cycles. After NA cycles, the analog accumulator/filter 850 provides accumulated analog values INGP and INGN. The analog accumulator/filter 850 also performs low pass filtering of wideband noise above its cutoff frequency. The outputs INGP and INGN of analog accumulator/filter 850 may be supplied through an amplifier to an analog-to-digital converter (not shown) for conversion of the accumulated analog value to a digital value that represents the value of the capacitance being sensed.

Referring to FIG. 7, it may be shown that the output voltage swing of the capacitance-to-voltage converter 520 is Cs/Cc*VH for mutual capacitance sensing and is Cf/Cc*(VH−Vcm) or Cf/Cc*Vcm for self capacitance sensing. The output swing in the mutual capacitance sensing mode is balanced with respect to the common mode voltage Vcm, regardless of the value of voltage VH. This is not the case for the self capacitance sensing mode. If the value of voltage VH is 2*Vcm, the capacitance-to-voltage converter output is balanced, but a higher value of voltage VH produces a larger negative swing of the output voltage as compared to the positive swing of the output voltage. It is known that use of a high value of voltage VH is beneficial to the improvement of the SNR of the system.

Accordingly, a second method of operation in the self capacitance sensing mode is described, in which only the falling edges are used to transfer the charge from the finger capacitance Cf to the integration capacitance Cc. As a result, the output OUTC2V of the capacitance-to-voltage converter swings only in the negative direction. The output OUTC2V is therefore S+N after the falling edge of the input signal TX, and the output OUTC2V is +N when the input signal TX switches back to the high level prior to the next falling transition.

Figure 11:
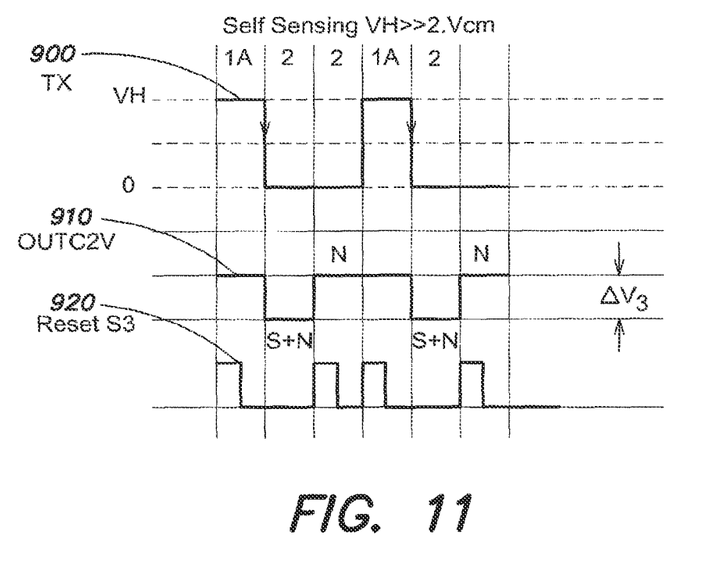
FIG. 11 is a timing diagram that illustrates operation of the dual mode capacitive sensing circuit in the self capacitance sensing mode with a high voltage input signal.

The self capacitance sensing mode with a high value of voltage VH is illustrated in the timing diagram of FIG. 11. It is assumed that voltage VH has a value greater than 2*Vcm. A waveform 900 represents the transmit signal TX applied to the force node F or the sense node S. The transmit signal TX switches between voltage VH and the common mode voltage Vcm. A waveform 910 represents the output OUTC2V of amplifier 522. As shown, the output of the capacitance-to-voltage converter 520 or 820 swings only in the negative direction. A waveform 920 represents a reset signal applied to switch 526 of the capacitance-to-voltage converter 520 or 820.

Figure 12:
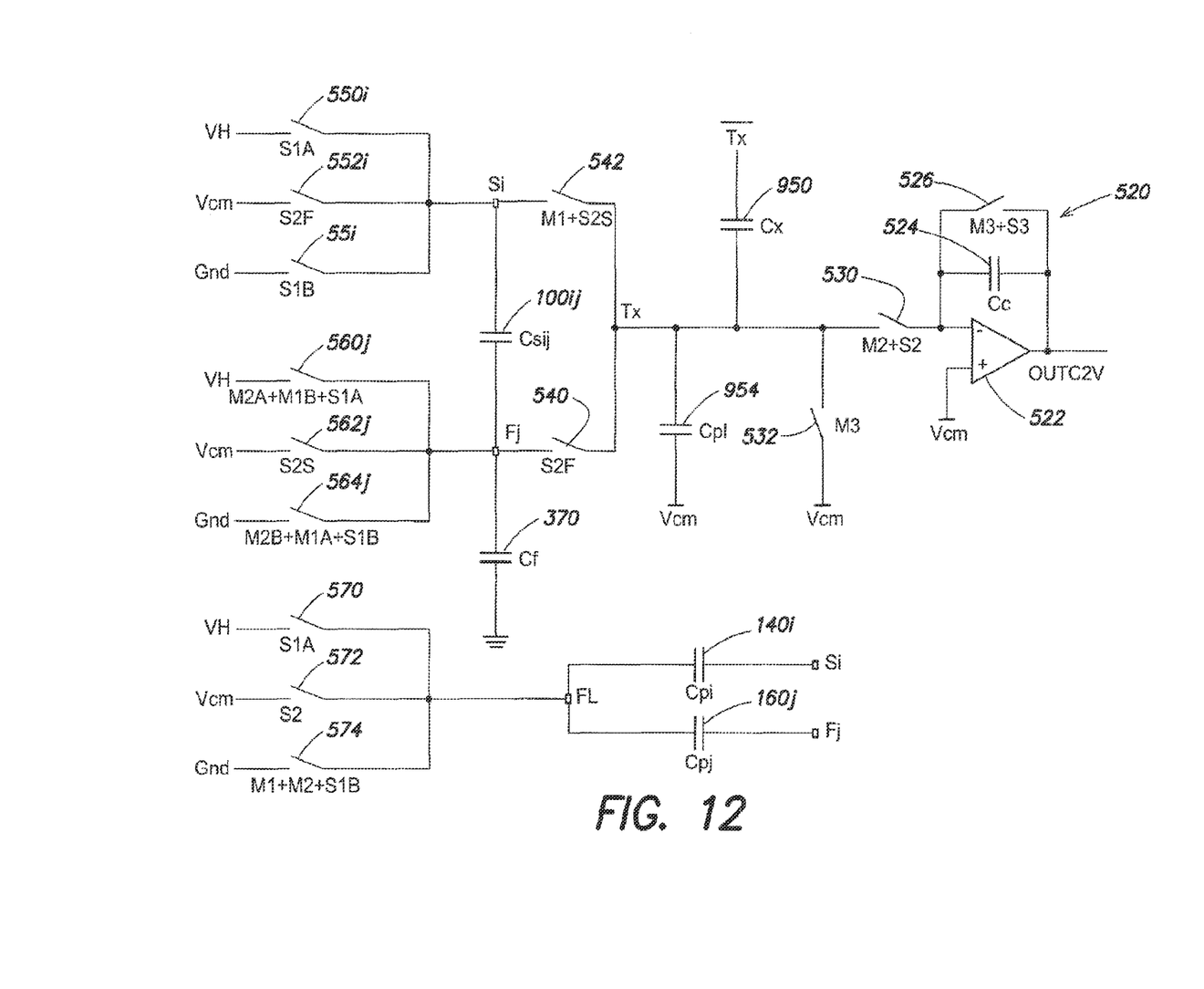
FIG. 12 is a schematic diagram of a dual mode capacitance sensing circuit incorporating parasitic capacitance cancellation.

A schematic diagram of a dual mode capacitance sensing circuit incorporating parasitic capacitance cancellation is shown in FIG. 12. Like elements in FIGS. 7 and 12 have the same reference characters. Capacitance 100 (Cs) between force node $F_j$ and $S_i$ represents the capacitance between column conductor and line conductor of the capacitive touch matrix. During the mutual capacitance sensing mode, capacitance ΔCs represents the change in capacitance produced by a finger or other object touching or in proximity to the intersection between the column conductor and the line conductor of the capacitive touch matrix. To cancel the fixed value of the capacitance 100, a cancellation capacitance 950 (Cx) may be used. The cancellation capacitance 950 is connected to transmit node TX, and the complement of the transmit signal TX is supplied through cancellation capacitance 950 to capacitance-to-voltage converter 520. The complement of transmit signal TX may be an inverted squarewave at modulation frequency fc. Ideally, the cancellation capacitance 950 is equal in value to the matrix element capacitance 100, so that the output of the capacitance-to-voltage converter 520 is zero, except when a finger or other object contacts or is in proximity to matrix element capacitance 100. Also as shown in FIG. 12 is a parasitic capacitance 954 (Cp) of the capacitive touch matrix. The parasitic capacitance 954 may be connected to the common mode voltage Vcm.

Having thus described at least one illustrative embodiment of the invention, various alterations, modifications, and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A dual mode capacitance sensing circuit, comprising:
a capacitance-to-voltage converter including an amplifier and an integration capacitance coupled between an output and an inverting input of the amplifier;
a first switching circuit responsive to mutual mode control signals for controlling supply of signals from a sense node of a capacitive touch matrix to the capacitance-to-voltage converter in a mutual capacitance sensing mode and responsive to self mode control signals for controlling supply of signals from a force node of the capacitive touch matrix to the capacitance-to-voltage converter in a self capacitance sensing mode, wherein the capacitance sensing circuit is configurable for operation in the mutual capacitance sensing mode or the self capacitance sensing mode;

a floating node with a first capacitance between the floating node and the sense node and a second capacitance coupled between the floating node and the force node; and a second switching circuit configured to selectively apply high, common mode and low voltages to the floating node depending on operation in the mutual and self capacitance sensing modes.

2. A dual mode capacitance sensing circuit as defined in claim 1, wherein the capacitance-to-voltage converter further comprises a switching element connected across the integration capacitance to perform reset in the mutual and self capacitance sensing modes.

3. A dual mode capacitance sensing circuit as defined in claim 1, wherein the first switching circuit comprises a switching element connected in series with the inverting input of the amplifier and configured to connect sensing signals to the inverting input during portions of the mutual and self capacitance sensing modes.

4. A dual mode capacitance sensing circuit as defined in claim 1, wherein the capacitance-to-voltage converter further comprises a switching element configured to connect the inverting input of the amplifier to the common mode voltage during at least a portion of the mutual capacitance sensing mode.

5. A dual mode capacitance sensing circuit as defined in claim 1, wherein the capacitance-to-voltage converter has a single-ended input and a differential output.

6. A dual mode capacitance sensing circuit as defined in claim 1, further comprising a third switching circuit including chopper switching elements configured to connect the force node to the high voltage in portions of the mutual capacitance sensing mode and in portions of the self capacitance sensing mode and to connect the force node to the low voltage in portions of the mutual capacitance sensing mode and in portions of the self capacitance sensing mode.

7. A dual mode capacitance sensing circuit as defined in claim 1, wherein the second switching circuit comprises a switching element configured to connect the floating node to the low voltage in portions of the mutual capacitance sensing mode and in portions of the self capacitance sensing mode.

8. A dual mode capacitance sensing circuit as defined in claim 1, further comprising a third switching circuit including chopper switching elements configured to alternately connect the sense node to the high voltage and to the low voltage in portions of the self capacitance sensing mode.

9. A capacitance sensing circuit of claim 1, wherein the first and second capacitances are parasitic capacitances.

10. A capacitance sensing circuit operable in a mutual sensing mode or in a self sensing mode, comprising:
    a capacitance-to-voltage converter comprising an amplifier and an integration capacitance coupled between an output and an inverting input of the amplifier;
    first, second and third sense switching elements coupled between a sense node and an input voltage, a common mode voltage and ground, respectively;
    first, second and third force switching elements coupled between a force node and the input voltage, the common mode voltage and ground, respectively;
    first, second and third floating switching elements coupled between a floating node and the input voltage, the common mode voltage and ground, respectively;
    a sense node switching element coupled between the sense node and the inverting input of the amplifier; and
    a force node input switching element coupled between the force node and the inverting input of the amplifier.

11. A capacitance sensing circuit for a capacitive sensing panel including a plurality of first lines intersecting a plurality of second lines, wherein a mutual capacitance exists between each pair of intersecting first and second lines, comprising:
    a capacitance-to-voltage converter comprising an amplifier and an integration capacitance coupled between an output and an inverting input of the amplifier;
    a first switching circuit configured to selectively connect the inverting input to one of said first lines or one of said second lines;
    a second switching circuit configured to selectively connect an input voltage, a common mode voltage and a ground voltage to said one of said first lines depending on operation of the capacitive sensing panel in self capacitance mode and mutual capacitance mode; and
    a third switching circuit configured to selectively connect the input voltage, the common mode voltage and the ground voltage to said one of said second lines depending on operation of the capacitive sensing panel in self capacitance mode and mutual capacitance mode.

12. The capacitance sensing circuit of claim 11, further comprising:
    a floating node;
    a first capacitance between the floating node and said one of said first lines;
    a second capacitance between the floating node and said one of said second lines; and
    a fourth switching circuit configured to selectively connect the input voltage, the common mode voltage and the ground voltage to said floating node depending on operation of the capacitive sensing panel in self capacitance mode and mutual capacitance mode.

13. The capacitance sensing circuit of claim 12, wherein the first and second capacitances are parasitic capacitances.

14. A capacitance sensing circuit for operating a capacitive touch screen in both a mutual sensing mode and in a self sensing mode, comprising:
    a capacitance-to-voltage converter comprising an amplifier and an integration capacitance coupled between an output and an inverting input of the amplifier;
    a sense node switching element coupled between a sense node of the capacitive touch screen and the inverting input of the amplifier;
    a force node input switching element coupled between a force node of the capacitive touch screen and the inverting input of the amplifier;
    a first switching circuit configured to selectively apply an input voltage, a common mode voltage and a ground voltage to the force node depending on operation of the capacitive touch screen in mutual sensing and self sensing mode;
    a second switching circuit configured to selectively apply the input voltage, the common mode voltage and the ground voltage to the sense node depending on operation of the capacitive touch screen in mutual sensing and self sensing mode; and
    a third switching circuit configured to selectively apply the input voltage, the common mode voltage and the ground voltage to a floating node of the capacitive touch screen depending on operation of the capacitive touch screen in mutual sensing and self sensing mode.

15. The capacitance sensing circuit of claim 14, further comprising:
    a first parasitic capacitance between the floating node and said sense node; and a second capacitance between the floating node and said force node.

\* \* \* \* \*